US012676294B2

(12) United States Patent
Inoue et al.

(10) Patent No.: US 12,676,294 B2
(45) Date of Patent: Jul. 7, 2026

(54) WAFER PLACEMENT TABLE

(71) Applicant: NGK Insulators, Ltd., Nagoya-City (JP)

(72) Inventors: Seiya Inoue, Handa-City (JP); Tatsuya Kuno, Nagoya-City (JP); Ikuhisa Morioka, Handa-City (JP)

(73) Assignee: NGK INSULATORS, LTD., Nagoya (JP)

( * ) Notice: Subject to any disclaimer, the term of this patent is extended or adjusted under 35 U.S.C. 154(b) by 508 days.

(21) Appl. No.: 17/818,748

(22) Filed: Aug. 10, 2022

(65) Prior Publication Data

US 2023/0144107 A1 May 11, 2023

(30) Foreign Application Priority Data

Nov. 10, 2021 (JP) ................................. 2021-183240

(51) Int. Cl.
*H01J 37/32* (2006.01)
*H10P 72/00* (2026.01)
(Continued)

(52) U.S. Cl.
CPC ........ *H01J 37/32724* (2013.01); *H10P 72/72* (2026.01); *H10P 72/722* (2026.01);
(Continued)

(58) Field of Classification Search
CPC ......... H01L 21/67069; H01L 21/67103; H01L 21/67109; H01L 21/6831; H01L 21/6833;
(Continued)

(56) References Cited

U.S. PATENT DOCUMENTS

2004/0042152 A1*  3/2004  Ishizaka ............ H01L 21/67109
                                                        361/234
2005/0051098 A1*  3/2005  Aramaki ............. C23C 16/4586
                                                        118/728
(Continued)

FOREIGN PATENT DOCUMENTS

CN      109300763 A      2/2019
JP        5666748 B1      2/2015
(Continued)

OTHER PUBLICATIONS

Taiwanese Office Action dated Apr. 13, 2023 (Application No. 111133892).
(Continued)

*Primary Examiner* — Gordon Baldwin
*Assistant Examiner* — Todd M Seoane
(74) *Attorney, Agent, or Firm* — Muncy, Geissler, Olds & Lowe, P.C.

(57) ABSTRACT

A wafer placement table includes a ceramic base having a wafer placement surface on its top surface where a wafer is able to be placed and incorporating an electrode, a cooling base having a refrigerant flow channel, and a bonding layer that bonds the ceramic base with the cooling base, wherein in an area that overlaps the wafer placement surface in plan view of the refrigerant flow channel, a distance from a ceiling surface of the refrigerant flow channel to the wafer placement surface at a most downstream part of the refrigerant flow channel is shorter than the distance at a most upstream part of the refrigerant flow channel.

6 Claims, 6 Drawing Sheets

(51) Int. Cl.

| | | |
|---|---|---|
| *H10P 72/72* | (2026.01) | |
| *H10P 72/76* | (2026.01) | |

(52) U.S. Cl.
CPC ...... *H10P 72/7624* (2026.01); *H10P 72/0432* (2026.01); *H10P 72/0434* (2026.01); *H10P 72/7616* (2026.01)

(58) Field of Classification Search
CPC ............. H01L 21/687; H01L 21/68714; H01L 21/68735; H01L 21/68757; H01L 21/68785; H01J 37/32532; H01J 37/32541; H01J 37/3255; H01J 37/32577; H01J 37/32697; H01J 37/32522; H01J 37/32724; H01J 2237/002
See application file for complete search history.

(56) References Cited

U.S. PATENT DOCUMENTS

| | | | | |
|---|---|---|---|---|
| 2015/0036261 | A1 | 2/2015 | Jindo et al. | |
| 2015/0077895 | A1* | 3/2015 | Jindo ................... | C04B 35/645 |
| | | | | 228/121 |
| 2015/0153116 | A1* | 6/2015 | Sekiguchi .............. | F28F 13/06 |
| | | | | 165/172 |
| 2017/0352565 | A1* | 12/2017 | Zhang ................ | C23C 16/4587 |
| 2018/0308737 | A1* | 10/2018 | Moriya .............. | H01L 21/6831 |
| 2019/0035609 | A1* | 1/2019 | Tobe ................ | H01L 21/67109 |
| 2020/0035536 | A1* | 1/2020 | Eto .................... | H01L 21/6833 |
| 2020/0286755 | A1* | 9/2020 | Ito ..................... | H01L 21/67109 |
| 2020/0312684 | A1 | 10/2020 | Mine et al. | |
| 2020/0395236 | A1 | 12/2020 | Iijima et al. | |
| 2021/0028029 | A1 | 1/2021 | Mo | |
| 2021/0183679 | A1* | 6/2021 | Kuribayashi ..... | H01L 21/67103 |

FOREIGN PATENT DOCUMENTS

| | | | | |
|---|---|---|---|---|
| JP | 5666749 | B1 | 2/2015 | |
| JP | 2019-029373 | A | 2/2019 | |
| JP | 6703647 | B2 | 6/2020 | |
| JP | 2020-145238 | A | 9/2020 | |
| JP | 2020-161597 | A | 10/2020 | |
| KR | 10-2017-0087844 | A | 7/2017 | |
| KR | 10-2019-0011686 | A | 2/2019 | |
| KR | 10-2020-0106456 | A | 9/2020 | |
| TW | 201504192 | A | 2/2015 | |
| TW | 202105596 | A | 2/2021 | |
| TW | 202119526 | A | 5/2021 | |
| WO | 2014/141974 | A1 | 9/2014 | |
| WO | WO-2019230031 | A1 * | 12/2019 | .............. B23Q 3/15 |

OTHER PUBLICATIONS

Japanese Office Action (with English translation) dated May 21, 2024 (Application No. 2021-183240).
Korean Office Action (Application No. 10-2022-0104052) dated Feb. 7, 2024 (with English translation) (11 pages).
Chinese Office Action dated Oct. 26, 2024 (Application No. 202210788357.5).

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic base having a wafer placement surface and incorporating an electrode, a cooling base having a refrigerant flow channel, and a bonding layer bonding the ceramic base with the cooling base. For example, Patent Literatures 1 and 2 describe that, in such a wafer placement table, the cooling base made of a metal matrix composite material of which the coefficient of linear thermal expansion is substantially the same as that of the ceramic base is used. Patent Literatures 1 and 2 also describe that the wafer placement table has a terminal hole for allowing insertion of a power supply terminal for supplying electric power to an electrode, gas holes for supplying He gas to the back surface of a wafer, and lift pin holes for allowing insertion of lift pins to lift a wafer from the wafer placement surface.

CITATION LIST

Patent Literature

PTL 1: Japanese Patent No. 5666748 B
PTL 2: Japanese Patent No. 5666749 B

SUMMARY OF THE INVENTION

However, a distance from a ceiling surface of the refrigerant flow channel to a wafer is constant from an inlet of the refrigerant flow channel to an outlet of the refrigerant flow channel, so the wafer tends to be easy to cool down near the inlet of the refrigerant flow channel and hard to cool down near the outlet. As a result, the soaking performance of a wafer can be not able to be sufficiently obtained as a result.

The present invention is made to solve such an inconvenience, and it is a main object to increase the soaking performance of a wafer.

A wafer placement table of the present invention includes a ceramic base having a wafer placement surface on its top surface where a wafer is able to be placed and incorporating an electrode, a cooling base having a refrigerant flow channel, and a bonding layer that bonds the ceramic base with the cooling base. In an area that overlaps the wafer placement surface in plan view of the refrigerant flow channel, a distance from a ceiling surface of the refrigerant flow channel to the wafer placement surface at a most downstream part of the refrigerant flow channel is shorter than the distance at a most upstream part of the refrigerant flow channel.

In the wafer placement table, in an area that overlaps the wafer placement surface in plan view of the refrigerant flow channel, a distance from a ceiling surface of the refrigerant flow channel to the wafer placement surface at a most downstream part of the refrigerant flow channel is shorter than the distance at a most upstream part of the refrigerant flow channel. When the wafer placement table is used, refrigerant flows from the most upstream part of the refrigerant flow channel toward the most downstream part while dissipating heat from a high-temperature wafer, so the temperature of refrigerant flowing through the refrigerant flow channel at the most downstream part is higher than the temperature of refrigerant flowing through the refrigerant flow channel at the most upstream part. On the other hand, since the distance from the ceiling surface of the refrigerant flow channel to the wafer placement surface at the most downstream part of the refrigerant flow channel is shorter than the distance at the most upstream part of the refrigerant flow channel, thermal resistance from the ceiling surface of the refrigerant flow channel to the wafer placement surface at the most downstream part is lower than thermal resistance from the ceiling surface of the refrigerant flow channel to the wafer placement surface at the most upstream part. Therefore, generally, it is possible to reduce the temperature difference between a location facing the most upstream part of the refrigerant flow channel and a location facing the most downstream part of the refrigerant flow channel in the wafer placement surface. Therefore, the soaking performance of a wafer increases.

In the wafer placement table of the present invention, a distance from the ceiling surface of the refrigerant flow channel to the wafer placement surface may gradually reduce from the most upstream part of the refrigerant flow channel toward the most downstream part. With this configuration, the soaking performance of a wafer increases.

In the wafer placement table of the present invention, a distance from the ceiling surface of the refrigerant flow channel to the wafer placement surface may be adjusted by at least one of a distance from the ceiling surface of the refrigerant flow channel to a top surface of the cooling base, a thickness of the bonding layer, and a thickness of the ceramic base. Of these, the distance from the ceiling surface of the refrigerant flow channel to the wafer placement surface is preferably adjusted by the distance from the ceiling surface of the refrigerant flow channel to the top surface the cooling base.

In the wafer placement table of the present invention, a distance from the ceiling surface of the refrigerant flow channel to the wafer placement surface at the most downstream part is preferably 50% to 90% of a distance from the ceiling surface of the refrigerant flow channel to the wafer placement surface at the most upstream part. When the percentage is lower than or equal to 90%, the soaking performance of a wafer W sufficiently increases. When the percentage is higher than or equal to 50%, it is possible to avoid occurrence of a crack above a most downstream part.

In the wafer placement table of the present invention, the cooling base may be made of a metal matrix composite material, and the bonding layer may be a metal bonding layer. With the structure that the cooling base is a metal matrix composite material and the bonding layer is a metal bonding layer, thermal resistance from the refrigerant flow channel to the wafer placement surface is small, so the wafer temperature is susceptible to the influence of the temperature gradient of refrigerant. Therefore, the significance to apply the present invention is high. Since the metal bonding layer has a high thermal conductivity, the metal bonding layer is suitable for heat dissipation. Furthermore, a difference in coefficient of thermal expansion between the ceramic base and the cooling base made of a metal matrix composite material is able to be reduced, so a trouble is less likely to occur even when the stress relaxation properties of the metal bonding layer are low.

The wafer placement table of the present invention may further include a hole extending through the cooling base in an up and down direction. In the refrigerant flow channel, a distance from the ceiling surface of the refrigerant flow channel to the wafer placement surface in an area around the hole may be shorter than the distance in an area outside the area around the hole. Generally, an area around just above such a hole in a wafer tends to be a hot spot; however, a distance from the ceiling surface of the refrigerant flow channel to the wafer placement surface in an area around the hole is shorter than the distance in an area outside the area around the hole. Therefore, heat dissipation of the area around the hole is promoted. Therefore, the soaking performance of a wafer increases.

DETAILED DESCRIPTION OF THE INVENTION

Figure 1:
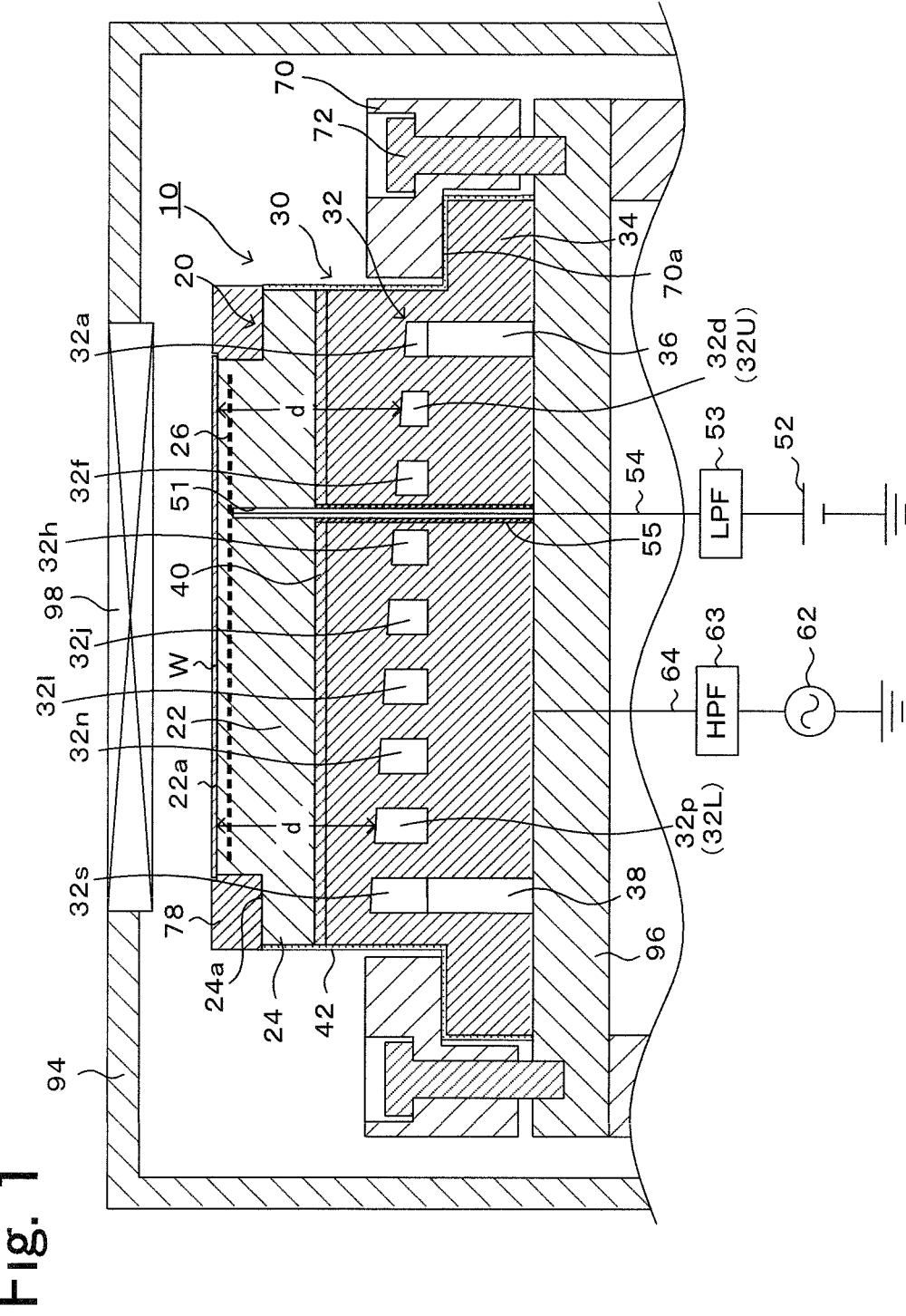
FIG. 1 is a vertical cross-sectional view of a wafer placement table 10 placed in a chamber 94.
Figure 2:
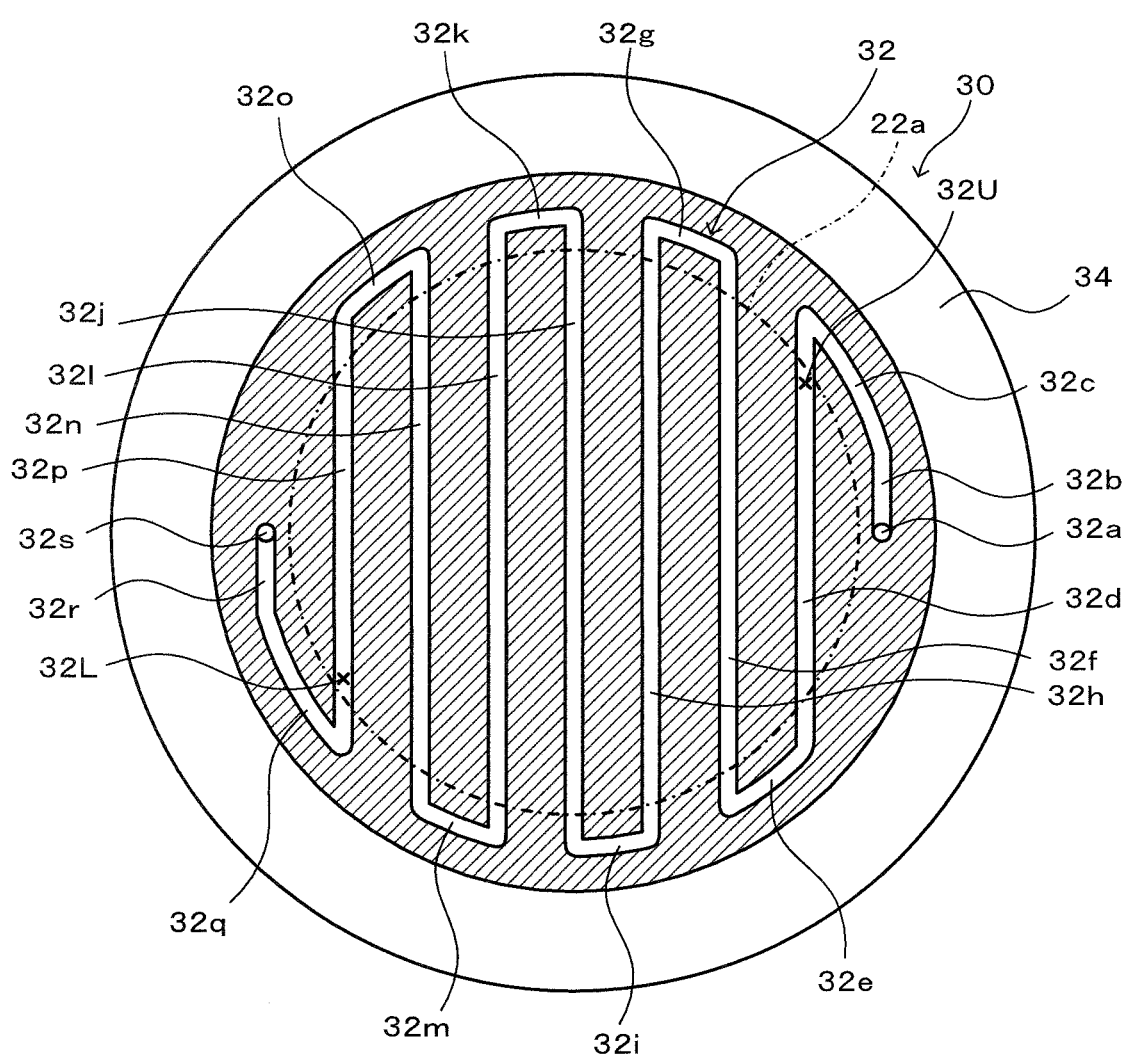
FIG. 2 is a sectional view of a cooling base 30 when a cross section taken along a horizontal plane passing through a refrigerant flow channel 32 is viewed from above.

A preferred embodiment of the present invention will be described below with reference to the drawings. FIG. 1 is a vertical cross-sectional view of a wafer placement table 10 (a sectional view taken along a plane including the central axis of the wafer placement table 10) placed in a chamber 94, and FIG. 2 is a sectional view of a cooling base 30 when a cross section taken along a horizontal plane passing through a refrigerant flow channel 32 is viewed from above. In FIG. 2, a terminal hole 51, a power supply terminal 54, an electrically insulating tube 55, and the like are omitted.

The wafer placement table 10 is used to perform CVD, etching, or the like on a wafer W by using plasma, and is fixed to a mounting plate 96 provided inside the semiconductor process chamber 94. The wafer placement table 10 includes a ceramic base 20, a cooling base 30, and a metal bonding layer 40.

The ceramic base 20 includes an outer peripheral 24 part having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attraction electrode 26 on the side close to the wafer placement surface 22a. The wafer attraction electrode 26 is made of a material that contains, for example, W, Mo, WC, MoC, or the like. The wafer attraction electrode 26 is a disk-shaped or mesh-shaped single-pole electrostatic attraction electrode. A layer of the ceramic base 20 on the upper side of the wafer attraction electrode 26 functions as a dielectric layer. A wafer attraction direct current power supply 52 is connected to the wafer attraction electrode 26 via a power supply terminal 54. The power supply terminal 54 is inserted through a terminal hole 51 provided between the bottom surface of the wafer attraction electrode 26 and the bottom surface of the cooling base 30 in the wafer placement table 10. The power supply terminal 54 is provided so as to pass through an electrically insulating tube 55 disposed in a through-hole extending through the cooling base 30 and the metal bonding layer 40 in the up and down direction in the terminal hole 51 and reach the wafer attraction electrode 26 from the bottom surface of the ceramic base 20. A low pass filter (LPF) 53 is provided between the wafer attraction direct current power supply 52 and the wafer attraction electrode 26.

The cooling base 30 is a disk member made of a metal matrix composite material (also referred to as metal matrix composite (MMC)). The cooling base 30 has the refrigerant flow channel 32 in which refrigerant is able to circulate. The refrigerant flow channel 32 is connected to a refrigerant supply passage 36 and a refrigerant discharge passage 38, and refrigerant discharged from the refrigerant discharge passage 38 is adjusted in temperature and then returned to the refrigerant supply passage 36 again. Examples of the MMC include a material including Si, SiC, and Ti, and a material obtained by impregnating an SiC porous body with Al and/or Si. The material including Si, SiC, and Ti is referred to as SiSiCTi, the material that impregnates an SiC porous body with Al is referred to as AlSiC, and the material that impregnates an SiC porous body with Si is referred to as SiSiC. When the ceramic base 20 is an alumina base, the MMC used for the cooling base 30 is preferably AlSiC, SiSiCTi, or the like of which the coefficient of thermal expansion is close to the coefficient of thermal expansion of alumina. The cooling base 30 is connected to an RF power supply 62 via a power supply terminal 64. A high pass filter (HPF) 63 is disposed between the cooling base 30 and the RF power supply 62. The cooling base 30 has a flange 34 on the bottom surface side. The flange 34 is used to clamp the wafer placement table 10 to a mounting plate 96.

As shown in FIG. 2, the refrigerant flow channel 32 is formed in a one-stroke pattern from an inlet 32a to an outlet 32s over the entire area other than the flange 34 in the cooling base 30 when the cross section of the refrigerant flow channel 32, taken along the horizontal plane, is viewed from above. In the present embodiment, the refrigerant flow channel 32 is formed in a zigzag shape. Specifically, the refrigerant flow channel 32 is formed in a zigzag shape so as to run from the inlet 32a connected to the refrigerant supply passage 36 via a straight part 32b, a folded part 32c, a straight part 32d, a folded part 32e, a straight part 32f, a folded part 32g, a straight part 32h, a folded part 32i, a straight part 32j, a folded part 32k, a straight part 32i, a folded part 32m, a straight part 32n, a folded part 32o, a straight part 32p, a folded part 32q, and a straight part 32r to the outlet 32s connected to the refrigerant discharge passage 38. Here, when a most upstream part 32U and a most downstream part 32L are determined in an area that overlaps the wafer placement surface 22a in plan view of the refrigerant flow channel 32, the most upstream part 32U and the most downstream part 32L are at locations shown in FIG. 2. As shown in FIG. 1, a distance d from the ceiling surface of the refrigerant flow channel 32 to the wafer placement surface 22a at the most downstream part 32L is shorter than the distance d at the most upstream part 32U. The distance d gradually reduces from the most upstream part 32U toward the most downstream part 32L. In the present embodiment, as shown in FIG. 1, the ceiling surfaces at the inlet 32a, the outlet 32s, and the straight parts 32d, 32f, 32h, 32j, 321, 32n, 32p of the refrigerant flow channel 32 are inclined downward from the outlet 32s side toward the inlet 32a side. The bottom surface of the refrigerant flow channel 32 is disposed in the same horizontal plane. The distance d at the most downstream part 32L is preferably 50% to 90% of the distance d at the most upstream part 32U.

When the relationship between the location in the refrigerant flow channel 32 and the distance d is represented by a graph, the distance d may continuously reduce or reduce in a stepwise manner from the most upstream part 32U toward the most downstream part 32L, and preferably continuously reduces. The case where the distance d continuously reduces from the most upstream part 32U toward the most downstream part 32L may be, for example, a case where the distance d continuously reduces at a constant gradient (slope), a case where the distance d reduces while drawing a downward-convex curve, or a case where the distance d reduces while drawing an upward-convex curve.

The metal bonding layer 40 bonds the bottom surface of the ceramic base 20 with the top surface of the cooling base 30. The metal bonding layer 40 may be, for example, a layer made of solder or a brazing metal material. The metal bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material.

The side surface of the outer peripheral part 24 of the ceramic base 20, the outer periphery of the metal bonding layer 40, and the side surface of the cooling base 30 are coated with an electrically insulating film 42. Examples of the electrically insulating film 42 include a sprayed film made of alumina, yttria, or the like.

The thus configured wafer placement table 10 is attached to the mounting plate 96 inside the chamber 94 by using a clamp member 70. The clamp member 70 is an annular member with a substantially inverted L-shaped cross section and has an inner peripheral step surface 70a. The wafer placement table 10 and the mounting plate 96 are united by the clamp member 70. In a state where the inner peripheral step surface 70a of the clamp member 70 is placed on the flange 34 of the cooling base 30 of the wafer placement table 10, bolts 72 are inserted from the top surface of the clamp member 70 and screwed to threaded holes provided on the top surface of the mounting plate 96. The bolts 72 are mounted at multiple locations (for example, eight locations or 12 locations) provided at equal intervals along the circumferential direction of the clamp member 70. The clamp member 70 and the bolts 72 may be made of an electrically insulating material or may be made of an electrically conductive material (metal or the like).

Figure 3:
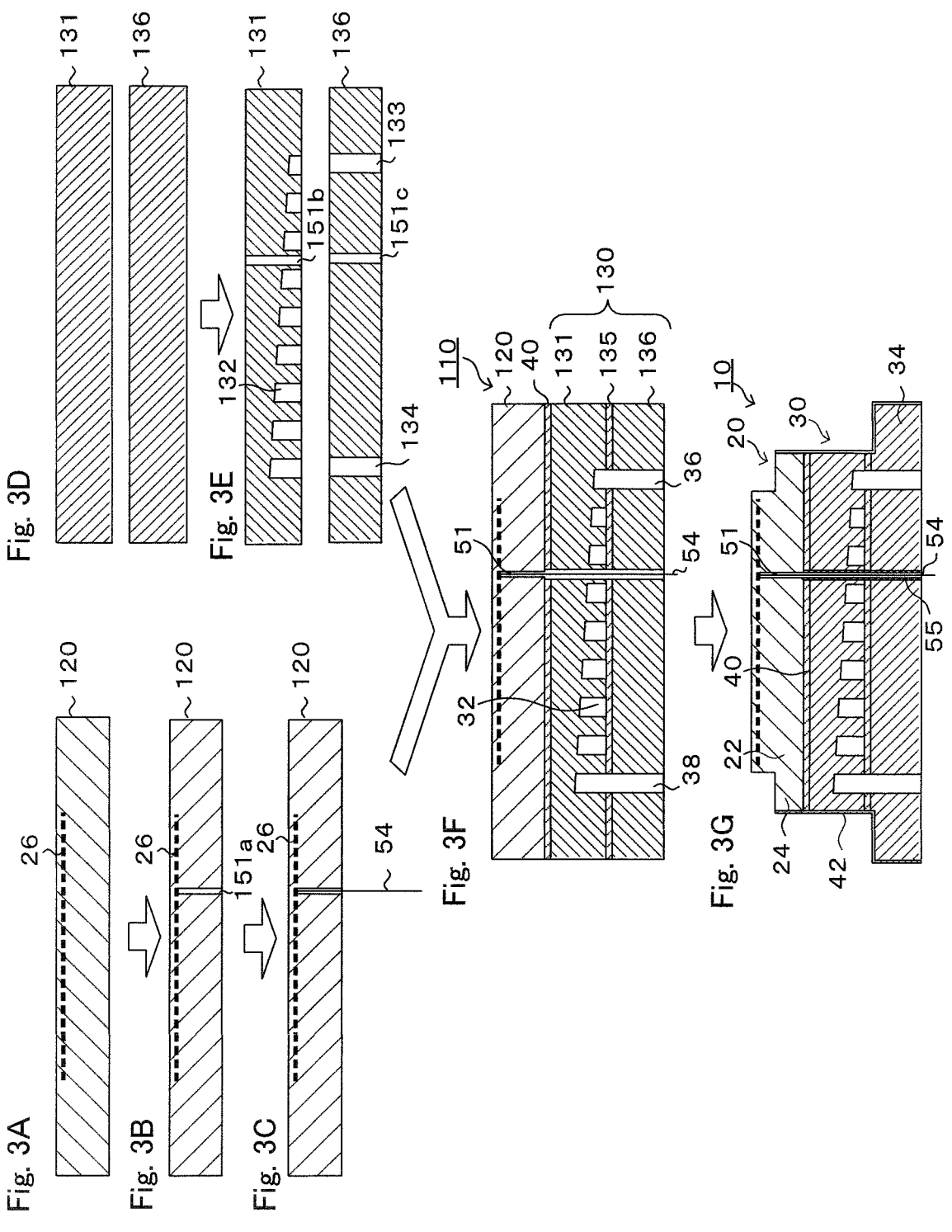
FIGS. 3A to 3G are manufacturing process charts of the wafer placement table 10.

Next, an example of manufacturing of the wafer placement table 10 will be described with reference to FIGS. 3A to 3G. FIGS. 3A to 3G are a manufacturing process chart of the wafer placement table 10. Initially, a disk-shaped ceramic sintered body 120 that is the source of the ceramic base 20 is made by firing a ceramic powder molded body by hot pressing (FIG. 3A). The ceramic sintered body 120 incorporates the wafer attraction electrode 26. Subsequently, a terminal hole upper part 151a is formed from the bottom surface of the ceramic sintered body 120 to the wafer attraction electrode 26 (FIG. 3B). Then, the power supply terminal 54 is inserted into the terminal hole upper part 151a, and the power supply terminal 54 and the wafer attraction electrode 26 are bonded (FIG. 3C).

In parallel with this, two MMC disk members 131, 136 are made (FIG. 3D). Then, holes extending through both the MMC disk members 131, 136 in the up and down direction are perforated, and a groove 132 that will be finally the refrigerant flow channel 32 is formed on the bottom surface of the upper-side MMC disk member 131 (FIG. 3E). Specifically, a terminal hole middle part 151b is perforated in the upper-side MMC disk member 131. The groove 132 is formed by machining the upper-side MMC disk member 131 so as to have a shape similar to the refrigerant flow channel 32. A terminal hole lower part 151c, a refrigerant supply passage through-hole 133, and a refrigerant discharge passage through-hole 134 are perforated in the lower-side MMC disk member 136. When the ceramic sintered body 120 is made of alumina, the MMC disk members 131, 136 are preferably made of SiSiCTi or AlSiC. This is because the coefficient of thermal expansion of alumina and the coefficient of thermal expansion of SiSiCTi or AlSiC are almost the same.

The disk member made of SiSiCTi can be made by, for example, as follows. Initially, a powder mixture is made by mixing silicon carbide, metal Si and metal Ti. After that, a disk-shaped molded body is made by uniaxial pressing of the obtained powder mixture, and the molded body is sintered by hot pressing in an inert atmosphere, with the result that the disk member made of SiSiCTi is obtained.

Subsequently, a metal bonding material is disposed between the bottom surface of the upper-side MMC disk member 131 and the top surface of the lower-side MMC disk member 136, and a metal bonding material is disposed on the top surface of the upper-side MMC disk member 131. Through-holes are provided in advance in each of the metal bonding materials at locations facing the holes. The power supply terminal 54 of the ceramic sintered body 120 is inserted into the terminal hole middle part 151b and the terminal hole lower part 151c, and the ceramic sintered body 120 is placed on the metal bonding material disposed on the top surface of the MMC disk member 131. Thus, a laminated body in which the lower-side MMC disk member 136, the metal bonding material, the upper-side MMC disk member 131, the metal bonding material, and the ceramic sintered body 120 are laminated in this order from the bottom is obtained. By pressurizing the laminated body while heating the laminated body (TCB), a bonded body 110 is obtained (FIG. 3F). The bonded body 110 is configured such that the ceramic sintered body 120 is bonded via the metal bonding layer 40 to the top surface of the MMC block 130 that is the source of the cooling base 30. The MMC block 130 is the one in which the upper-side MMC disk member 131 and the lower-side MMC disk member 136 are bonded via a metal bonding layer 135. The MMC block 130 has the refrigerant flow channel 32, the refrigerant supply passage 36, the refrigerant discharge passage 38, and the terminal hole 51. The terminal hole 51 is a hole made up of the continuous terminal hole upper part 151a, terminal hole middle part 151b, and terminal hole lower part 151c.

TCB is performed, for example, as follows. In other words, the laminated body is pressurized at a temperature lower than or equal to a solidus temperature of the metal bonding material (for example, higher than or equal to a temperature obtained by subtracting 20° C. from the solidus temperature and lower than or equal to the solidus temperature) to perform bonding, after that the temperature is returned to a room temperature. Thus, the metal bonding material becomes the metal bonding layer. An Al—Mg bonding material or an Al—Si—Mg bonding material may be used as the metal bonding material at this time. When, for example, TCB is performed by using an Al—Si—Mg bonding material, the laminated body is pressurized in a state of being heated under vacuum atmosphere. The metal bonding material with a thickness of about 100 μm is preferable.

Subsequently, the ceramic base 20 with the central part 22 and the outer peripheral part 24 is obtained by cutting the outer periphery of the ceramic sintered body 120 to form a step. The cooling base 30 with the flange 34 is obtained by cutting the outer periphery of the MMC block 130 to form a step. The electrically insulating tube 55 that allows insertion of the power supply terminal 54 is disposed in the terminal hole 51 from the bottom surface of the ceramic base 20 to the bottom surface of the cooling base 30. The side surface of the outer peripheral part 24 of the ceramic base 20, the periphery of the metal bonding layer 40, and the side surface of the cooling base 30 are subjected to thermal spraying by using ceramic powder to form the electrically insulating film 42 (FIG. 3G). Thus, the wafer placement table 10 is obtained.

The cooling base 30 of FIG. 1 has been described as a single-piece product; however, as shown in FIG. 3G, the cooling base 30 may be configured such that two members are bonded by a metal bonding layer or may be configured such that three or more members are bonded by metal bonding layers.

Next, an example of the use of the wafer placement table 10 will be described with reference to FIG. 1. The wafer placement table 10 is fixed to the mounting plate 96 in the chamber 94 by the clamp member 70 as described above. A shower head 98 that discharges process gas from a large number of gas injection holes into the chamber 94 is disposed on the ceiling surface of the chamber 94.

A focus ring 78 is placed on the FR placement surface 24a of the wafer placement table 10, and a disk-shaped wafer W is placed on the wafer placement surface 22a. The focus ring 78 has a step along the inner periphery of an upper end part so as not to interfere with the wafer W. In this state, the wafer W is attracted to the wafer placement surface 22a by applying a direct current voltage of the wafer attraction direct current power supply 52 to the wafer attraction electrode 26. Then, the inside of the chamber 94 is set to a predetermined vacuum atmosphere (or decompression atmosphere), and an RF voltage from the RF power supply 62 is applied to the cooling base 30 while process gas is being supplied from the shower head 98. As a result, plasma is generated between the wafer W and the shower head 98. Then, the wafer W is subjected to CVD deposition or etching by using the plasma. As the wafer W is subjected to a plasma process, the focus ring 78 abrades; however, the focus ring 78 is thicker than the wafer W, replacement of the focus ring 78 is performed after processing a plurality of wafers W.

When a wafer W is processed with high-power plasma, it is necessary to efficiently cool the wafer W. In the wafer placement table 10, not a resin layer with a low thermal conductivity but the metal bonding layer 40 with a high thermal conductivity is used as the bonding layer between the ceramic base 20 and the cooling base 30. Therefore, performance to dissipate heat from a wafer W (heat dissipation performance) is high. Since a difference in thermal expansion between the ceramic base 20 and the cooling base 30 is small, a trouble is less likely to occur even when stress relaxation properties of the metal bonding layer 40 are low. Furthermore, a distance d from the ceiling surface of the refrigerant flow channel 32 to the wafer placement surface 22a at the most downstream part 32L of the refrigerant flow channel 32 is shorter than the distance d at the most upstream part 32U of the refrigerant flow channel 32. The distance d at the most downstream part 32L is shorter than the distance d at the most upstream part 32U. When the wafer placement table 10 is used, refrigerant flows from the most upstream part 32U of the refrigerant flow channel 32 toward the most downstream part 32L of the refrigerant flow channel 32 while dissipating heat from a high-temperature wafer W, so the temperature of refrigerant flowing through the refrigerant flow channel 32 at the most downstream part 32L is higher than the temperature of refrigerant flowing through the refrigerant flow channel 32 at the most upstream part 32U. On the other hand, since the distance d from the ceiling surface of the refrigerant flow channel 32 to the wafer placement surface 22a at the most downstream part 32L of the refrigerant flow channel 32 is shorter than the distance d at the most upstream part 32U of the refrigerant flow channel 32, thermal resistance from the ceiling surface of the refrigerant flow channel 32 to the wafer placement surface 22a at the most downstream part 32L is lower than thermal resistance from the ceiling surface of the refrigerant flow channel 32 to the wafer placement surface 22a at the most upstream part 32U. Therefore, generally, it is possible to reduce the temperature difference between a location facing the most upstream part 32U of the refrigerant flow channel 32 and a location facing the most downstream part 32L of the refrigerant flow channel 32 in the wafer placement surface 22a. The flow rate of refrigerant flowing through the refrigerant flow channel 32 is preferably set to 15 L/min to 50 L/min and more preferably set to 20 L/min to 40 L/min.

With the wafer placement table 10 of the above-described present embodiment, the distance d from the ceiling surface of the refrigerant flow channel 32 to the wafer placement surface 22a at the most downstream part 32L of the refrigerant flow channel 32 is shorter than the distance d at the most upstream part 32U of the refrigerant flow channel 32, so the soaking performance of a wafer W increases.

The distance d gradually reduces from the most upstream part 32U of the refrigerant flow channel 32 toward the most downstream part 32L of the refrigerant flow channel 32. Therefore, the soaking performance of a wafer W further increases.

Furthermore, the distance d is adjusted by a distance from the ceiling surface of the refrigerant flow channel 32 to the top surface of the cooling base 30. Therefore, the distance d is relatively easily adjusted.

Furthermore, the refrigerant flow channel 32 is formed in a zigzag shape when the cooling base 30 is viewed in plan. Therefore, the refrigerant flow channel 32 is easily routed all over the cooling base 30.

The distance d at the most downstream part 32L is preferably 50% to 90% of the distance d at the most upstream part 32U. When the percentage is lower than or equal to 90%, the soaking performance of a wafer W sufficiently increases. When the percentage is higher than or equal to 50%, it is possible to avoid occurrence of a crack above the most downstream part 32L.

In addition, the cooling base 30 is made of an MMC and is bonded to the ceramic base 20 via the metal bonding layer 40. With the structure that the cooling base 30 is an MMC and the bonding layer is the metal bonding layer 40, thermal resistance from the refrigerant flow channel 32 to the wafer placement surface 22a is small, so the wafer temperature is susceptible to the influence of the temperature gradient of refrigerant. Therefore, the significance to apply the present invention is high. Since the metal bonding layer 40 has a high thermal conductivity, the metal bonding layer 40 is suitable for heat dissipation. Since a difference in thermal expansion between the ceramic base 20 and the cooling base 30 made of an MMC is able to be reduced, a trouble is less likely to occur even when the stress relaxation properties of the metal bonding layer 40 are low.

The present invention is not limited to the above-described embodiment and may be, of course, implemented in various modes within the technical scope of the present invention.

Figure 4:
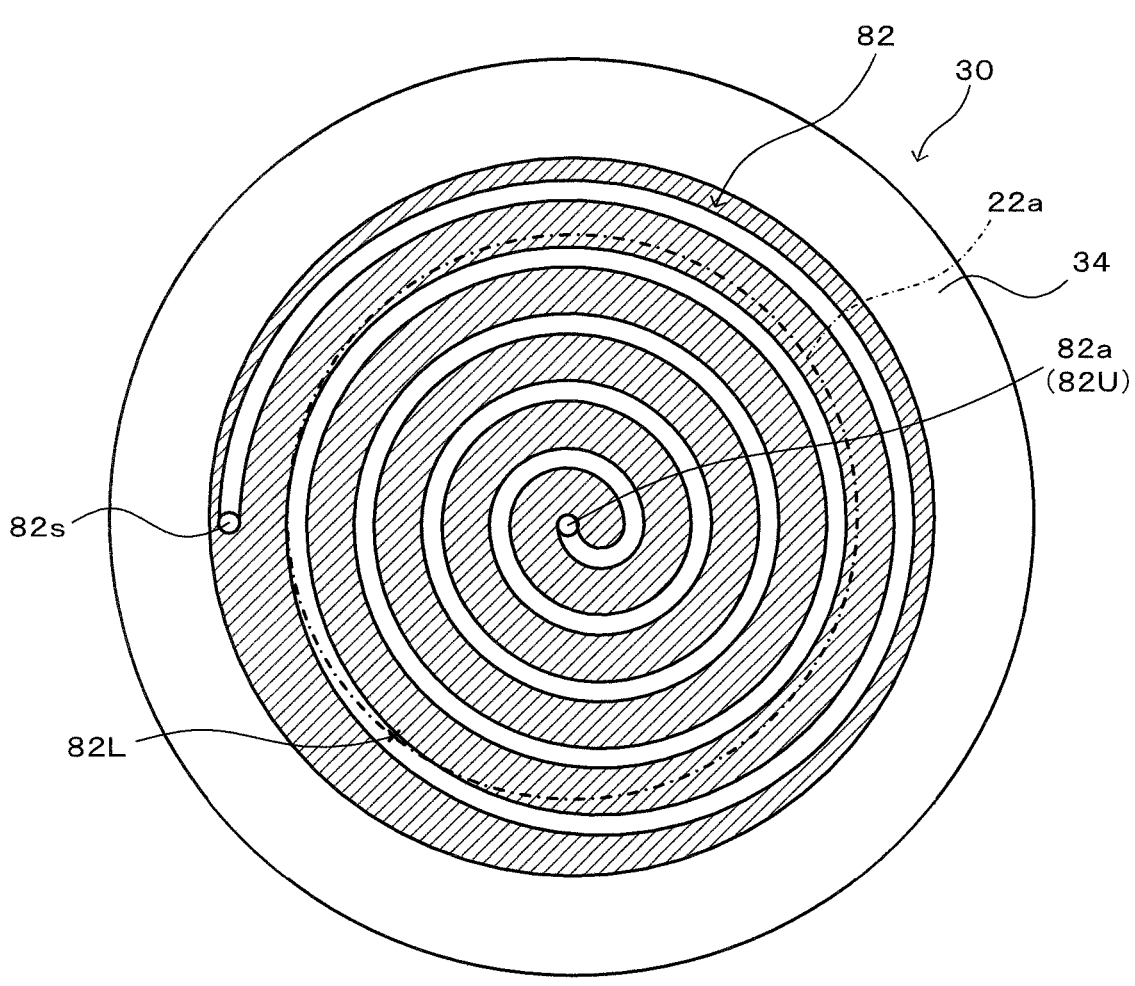
FIG. 4 is a sectional view of the cooling base 30 when a cross section taken along a horizontal plane passing through a refrigerant flow channel 82 is viewed from above.

In the above-described embodiment, instead of the refrigerant flow channel 32 in a zigzag shape in plan view, a refrigerant flow channel 82 in a spiral shape in plan view may be adopted as shown in FIG. 4. The refrigerant flow channel 82 is formed in a spiral shape all over a part excluding the flange 34 of the cooling base 30 in a one-stroke pattern from an inlet 82a provided at the center to an outlet 82s provided at an outer peripheral part. In this case, when a most upstream part 82U and a most downstream part 82L are determined in an area that overlaps the wafer placement surface 22a in plan view of the refrigerant flow channel 82, the most upstream part 82U and the most downstream part 82L are at locations shown in FIG. 4. Although not shown in the drawing, a distance d from the ceiling surface of the refrigerant flow channel 82 to the wafer placement surface 22a at the most downstream part 82L is shorter than the distance d at the most upstream part 82U. The distance d may be formed to gradually reduce from the most upstream part 82U toward the most downstream part 82L. Alternatively, the outer peripheral part of the refrigerant flow channel 82 may be set as an inlet, and the center may be set as an outlet.

Figure 5:
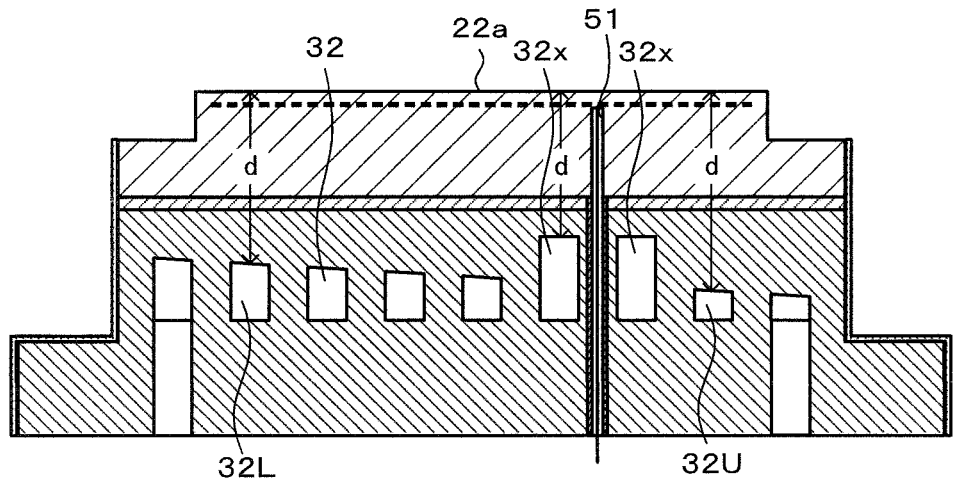
FIG. 5 is a vertical cross-sectional view of an example in which a part 32x with a short distance d is provided in the middle of the refrigerant flow channel 32.

In the above-described embodiment, as shown in FIG. 5, the refrigerant flow channel 32 may have a part 32x at which the distance d from the ceiling surface of the refrigerant flow channel 32 to the wafer placement surface 22a is shorter in an area around the terminal hole 51 than the distance d in an area outside the area around the terminal hole 51. The refrigerant flow channel 32 is formed in a shape similar to that of the above-described embodiment except that the part 32x is provided, and the distance d at the most downstream part 32L is shorter than the distance d at the most upstream part 32U. The distance d gradually reduces from the most upstream part 32U of the refrigerant flow channel 32 toward the most downstream part 32L of the refrigerant flow channel 32 except an area around the terminal hole 51. Generally, an area around just above such the terminal hole 51 in the wafer placement surface 22a tends to be a hot spot, and, here, the distance d in an area around the terminal hole 51 is shorter than the distance d in an area outside the area around the terminal hole 51. Therefore, heat dissipation of the area around the terminal hole 51 is promoted. Therefore, the soaking performance of a wafer W increases. The distance d at the part 32x is preferably 50% to 90% of the distance d at the most upstream part 32U.

Figure 6:
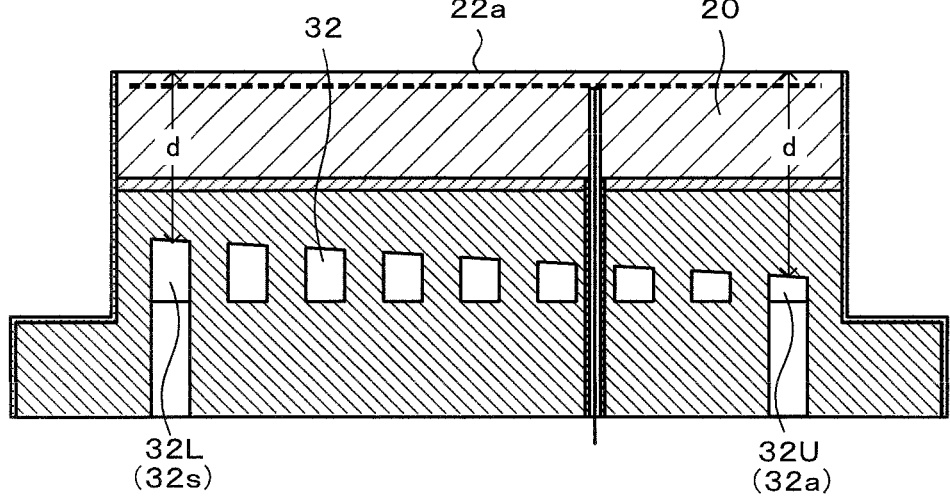
FIG. 6 is a vertical cross-sectional view of an example using a ceramic base 20 without an FR placement surface.

In the above-described embodiment, as shown in FIG. 6, the ceramic base 20 has the wafer placement surface 22a but the ceramic base 20 does not need to have an FR placement surface. In this case, when the most upstream part 32U and the most downstream part 32L are determined in an area that overlaps the wafer placement surface 22a in plan view of the refrigerant flow channel 32, the most upstream part 32U and the most downstream part 32L respectively coincide with the inlet 32a and the outlet 32s.

Figure 7:
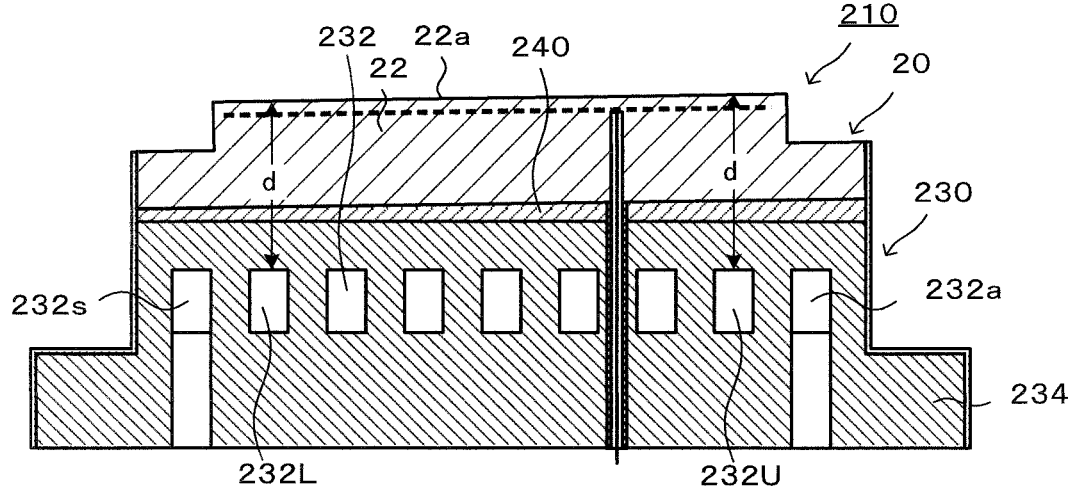
FIG. 7 is a vertical cross-sectional view of a wafer placement table 210.

In the above-described embodiment, the distance d from the ceiling surface of the refrigerant flow channel 32 to the wafer placement surface 22a is adjusted by the distance from the ceiling surface of the refrigerant flow channel 32 to the top surface the cooling base 30; however, the configuration is not limited thereto. For example, as in the case of a wafer placement table 210 shown in FIG. 7, the distance d may be adjusted by the thickness of a metal bonding layer 240. The wafer placement table 210 is formed by bonding the ceramic base 20 with a cooling base 230 by the metal bonding layer 240. The ceramic base 20 is the same as that used in the above-described embodiment, and the thickness of the central part 22 is uniform. In the cooling base 230, the thickness of a central part except a flange 234 is uniform, the distance between the ceiling surface of the refrigerant flow channel 232 and the top surface of the cooling base 230 is also uniform, and the height (the length from the bottom surface to the ceiling surface) of the refrigerant flow channel 232 is also uniform. The shape of the refrigerant flow channel 232 in plan view is a zigzag shape, as in the case of FIG. 2. The metal bonding layer 240 is provided such that the thickness gradually reduces from an inlet 232a of the refrigerant flow channel 232 toward an outlet 232s of the refrigerant flow channel 232. With this configuration as well, the distance d between the ceiling surface of the refrigerant flow channel 232 and the wafer placement surface 22a at a most downstream part 232L of the refrigerant flow channel 232 may be shorter than the distance d at a most upstream part 232U of the refrigerant flow channel 232.

Figure 8:
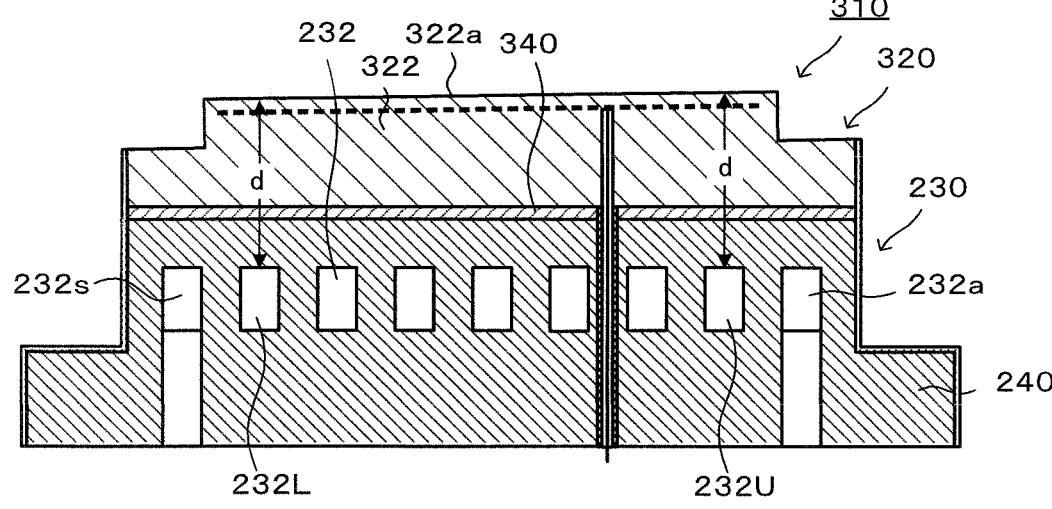
FIG. 8 is a vertical cross-sectional view of a wafer placement table 310.

Alternatively, as in the case of a wafer placement table 310 shown in FIG. 8, the distance d may be adjusted by the thickness of a ceramic base 320. The wafer placement table 310 is formed by bonding the ceramic base 320 with the cooling base 230 by the metal bonding layer 340. The cooling base 230 is the same as that used in FIG. 7. The ceramic base 320 is provided such that the thickness of a central part 322 gradually reduces from the inlet 232a of the refrigerant flow channel 232 toward the outlet 232s of the refrigerant flow channel 232. The thickness of the metal bonding layer 340 is uniform. With this configuration as well, the distance d between the ceiling surface of the refrigerant flow channel 232 and a wafer placement surface 322a at a most downstream part 232L of the refrigerant flow channel 232 may be shorter than the distance d at a most upstream part 232U of the refrigerant flow channel 232.

In the above-described embodiment, the ceiling surfaces at the inlet 32a, the outlet 32s, and the straight parts 32d, 32f, 32h, 32j, 321, 32n, 32p of the refrigerant flow channel 32 are inclined surfaces. Alternatively, the ceiling surfaces may be horizontal surfaces.

In the above-described embodiment, the distance d between the ceiling surface of the refrigerant flow channel 32 and the wafer placement surface 22a is set to gradually reduce from the most upstream part 32U toward the most downstream part 32L; however, the configuration is not limited thereto. The distance d may be configured in any shape between the most upstream part 32U and the most downstream part 32L as long as the distance d at the most downstream part 32L is shorter than the distance d at the most upstream part 32U. For example, between the most upstream part 32U and the most downstream part 32L, there may be a section in which the distance d is uniform, or a section in which the distance d gradually increases from the most upstream part 32U toward the most downstream part 32L, or a section in which the distance d irregularly changes.

In the above-described embodiment, on the wafer placement surface 22a, a seal band may be formed along the outer periphery, a plurality of small projections may be formed all over the surface, and a wafer W may be supported by the top face of the seal band and the top faces of the small projections. In this case, the distance d between the ceiling surface of the refrigerant flow channel 32 and the wafer placement surface 22*a* is a distance between the ceiling surface of the refrigerant flow channel 32 and the top faces of the small projections (the top face of the seal band).

In the above-described embodiment, the wafer placement table 10 may have a plurality of holes that extend through the wafer placement table 10 in the up and down direction. Such holes include a plurality of gas holes that open at the wafer placement surface 22*a* and lift pin holes for allowing insertion of lift pins used to raise and lower the wafer W with respect to the wafer placement surface 22*a*. The plurality of gas holes is provided at adequate locations when the wafer placement surface 22*a* is viewed in plan. Heat transfer gas, such as He gas, is supplied to the gas holes. Generally, the gas holes are provided so as to open at locations where the seal band or the small projections are not provided on the wafer placement surface 22*a* on which the seal band and the small projections are provided. When heat transfer gas is supplied to the gas holes, heat transfer gas is filled into a space on the back side of the wafer W placed on the wafer placement surface 22*a*. The plurality of lift pin holes is provided at equal intervals along the concentric circle of the wafer placement surface 22*a* when the wafer placement surface 22*a* is viewed in plan. When the wafer placement table 10 has gas holes and lift pin holes, a part where the distance d from the ceiling surface of the refrigerant flow channel 32 to the wafer placement surface 22*a* is shorter in an area around each hole than in an area outside the area around each hole may be provided as in the case of the part 32*x* of FIG. 5. With this configuration, the soaking performance of a wafer W further increases.

In the above-described embodiment, the cooling base 30 is made of an MMC; however, the configuration is not limited thereto. The cooling base 30 may be made of metal (for example, aluminum, titanium, molybdenum, tungsten, and alloys of them).

In the above-described embodiment, the ceramic base 20 and the cooling base 30 are bonded via the metal bonding layer 40; however, the configuration is not limited thereto. For example, instead of the metal bonding layer 40, a resin bonding layer may be used.

In the above-described embodiment, the wafer attraction electrode 26 is incorporated in the central part 22 of the ceramic base 20. Instead of or in addition to this, an RF electrode for generating plasma may be incorporated, and a heater electrode (resistance heating element) may be incorporated. A focus ring (FR) attraction electrode may be incorporated in the outer peripheral part 24 of the ceramic base 20, and an RF electrode or a heater electrode may be incorporated.

In the above-described embodiment, the ceramic sintered body 120 of FIG. 3A is made by firing a ceramic powder molded body by hot pressing. The molded body at that time may be made by laminating a plurality of molded tapes, or may be made by mold casting, or may be made by compacting ceramic powder.

The present application claims priority from Japanese Patent Application No. 2021-183240, filed on Nov. 10, 2021, the entire contents of which are incorporated herein by reference.

12

What is claimed is:
1. A wafer placement table comprising:
a ceramic base having a wafer placement surface on its top surface where a wafer is able to be placed and incorporating an electrode;
a cooling base having a refrigerant flow channel;
a bonding layer that bonds the ceramic base with the cooling base; and
two or more holes extending through the cooling base in an up and down direction, wherein
in an area that overlaps the wafer placement surface in plan view of the refrigerant flow channel, a distance from a ceiling surface of the refrigerant flow channel to the wafer placement surface at a most downstream part of the refrigerant flow channel overlapping the wafer placement surface is shorter than the distance at a most upstream part of the refrigerant flow channel overlapping the wafer placement surface; and
wherein the refrigerant flow channel is a single-layered structure with a single inlet and a single outlet; and
wherein the refrigerant flow channel is formed such that a distance from the ceiling surface of the refrigerant flow channel to the wafer placement surface in an area directly adjacent to each of the two or more holes is shorter than the distance in an area not directly adjacent to each of the two or more holes; and
wherein the distance from the ceiling surface of the refrigerant flow channel to the wafer placement surface in the area directly adjacent to each of the two or more holes is 50% to 90% of the distance from the ceiling surface of the refrigerant flow channel to the wafer placement surface at the most upstream part.
2. The wafer placement table according to claim 1, wherein
a distance from the ceiling surface of the refrigerant flow channel to the wafer placement surface gradually reduces from the most upstream part of the refrigerant flow channel toward the most downstream part.
3. The wafer placement table according to claim 1, wherein
a distance from the ceiling surface of the refrigerant flow channel to the wafer placement surface is adjusted by at least one of a distance from the ceiling surface of the refrigerant flow channel to a top surface of the cooling base, a thickness of the bonding layer, or a thickness of the ceramic base.
4. The wafer placement table according to claim 1, wherein
a distance from the ceiling surface of the refrigerant flow channel to the wafer placement surface at the most downstream part is 50% to 90% of a distance from the ceiling surface of the refrigerant flow channel to the wafer placement surface at the most upstream part.
5. The wafer placement table according to claim 1, wherein
the cooling base is made of a metal matrix composite material, and
the bonding layer is a metal bonding layer.
6. The wafer placement table according to claim 1, wherein
the two or more holes are selected from the group consisting of terminal holes, lift pin holes, gas holes and combinations thereof.

* * * * *